United States Patent
Muthuseenu et al.

(10) Patent No.: US 12,230,674 B2
(45) Date of Patent: Feb. 18, 2025

(54) RADIATION HARDENED HIGH VOLTAGE SUPERJUNCTION MOSFET

(71) Applicant: IceMos Technology Limited, Belfast (GB)

(72) Inventors: Kiraneswar Muthuseenu, Tempe, AZ (US); Samuel Anderson, Tempe, AZ (US); Takeshi Ishiguro, Fukushima (JP)

(73) Assignee: IceMos Technology Limited (GB)

( * ) Notice: Subject to any disclaimer, the term of this patent is extended or adjusted under 35 U.S.C. 154(b) by 0 days.

(21) Appl. No.: 18/358,282

(22) Filed: Jul. 25, 2023

(65) Prior Publication Data

US 2023/0369403 A1 Nov. 16, 2023

Related U.S. Application Data

(60) Division of application No. 17/804,491, filed on May 27, 2022, now Pat. No. 11,757,001, which is a continuation of application No. 16/934,738, filed on Jul. 21, 2020, now Pat. No. 11,362,179.

(51) Int. Cl.
| | |
|---|---|
| *H01L 29/08* | (2006.01) |
| *H01L 29/06* | (2006.01) |
| *H01L 29/10* | (2006.01) |
| *H01L 29/423* | (2006.01) |
| *H01L 29/66* | (2006.01) |

(Continued)

(52) U.S. Cl.
CPC ...... *H01L 29/0847* (2013.01); *H01L 29/0634* (2013.01); *H01L 29/1095* (2013.01); *H01L 29/4236* (2013.01); *H01L 29/66666* (2013.01); *H01L 29/7827* (2013.01); *H01L 21/26513* (2013.01)

(58) Field of Classification Search
CPC ............ H01L 29/0847; H01L 29/1095; H01L 29/0634; H01L 29/7827; H01L 29/4236; H01L 29/66666; H01L 21/26513
USPC ........................................................ 257/330
See application file for complete search history.

(56) References Cited

U.S. PATENT DOCUMENTS

| | | | |
|---|---|---|---|
| 6,091,107 A | 7/2000 | Amaratunga et al. | |
| 6,373,098 B1 | 4/2002 | Brush et al. | |
| 9,905,687 B1 * | 2/2018 | Zhu ..................... H01L 29/7801 |

(Continued)

*Primary Examiner* — Mohammad M Hoque
(74) *Attorney, Agent, or Firm* — Robert D. Atkins; PATENT LAW GROUP: Atkins and Associates, P.C.

(57) ABSTRACT

A high voltage superjunction MOSFET includes a semiconductor substrate and a semiconductor layer having columns of first and second conductivity. A buffer layer of the first conductivity is between the semiconductor substrate and semiconductor layer. A plug region of the second conductivity is formed at a semiconductor layer surface and extends to the columns. A source/drain region is formed at the semiconductor layer surface and is connected to the plug region. The source/drain region has a concentration of the first conductivity between about $1 \times 10^{19}$ cm$^{-3}$ and $1.5 \times 10^{20}$ cm$^{-3}$. A body region of the second conductivity is between the source/drain region and the first column and is connected to the plug region. A gate trench is formed in the semiconductor layer surface and extends toward the first column and has a trench gate electrode disposed therein. A dielectric layer separates the trench gate electrode from the first column.

27 Claims, 6 Drawing Sheets

(51) Int. Cl.
*H01L 29/78* (2006.01)
*H01L 21/265* (2006.01)

(56) References Cited

U.S. PATENT DOCUMENTS

| | | |
|---|---|---|
| 2008/0017897 A1 | 1/2008 | Saito et al. |
| 2008/0035992 A1 | 2/2008 | Kawaguchi et al. |
| 2008/0050877 A1 | 2/2008 | de Fresart et al. |
| 2011/0254088 A1 | 10/2011 | Darwish et al. |
| 2012/0098055 A1* | 4/2012 | Darwish ............. H01L 29/7397 |
| | | 257/330 |
| 2012/0168856 A1 | 7/2012 | Luo et al. |
| 2015/0021656 A1 | 1/2015 | Kitagawa |
| 2016/0268367 A1* | 9/2016 | Ishiguro .............. H01L 29/7813 |
| 2017/0271467 A1 | 9/2017 | Kono et al. |
| 2018/0033886 A1 | 2/2018 | Mauder et al. |
| 2019/0109215 A1* | 4/2019 | Yamashita .......... H01L 29/4238 |
| 2020/0119187 A1* | 4/2020 | Arai ........................ H01L 29/32 |
| 2021/0036116 A1 | 2/2021 | Kyogoku et al. |

* cited by examiner

RADIATION HARDENED HIGH VOLTAGE SUPERJUNCTION MOSFET

CLAIM OF DOMESTIC PRIORITY

The present application is a division of U.S. patent application Ser. No. 17/804,491, now U.S. Pat. No. 11,757,001, filed May 27, 2022, which is a continuation of U.S. patent application Ser. No. 16/934,738, now U.S. Pat. No. 11,362,179, filed Jul. 21, 2020, which applications are incorporated herein by reference.

BACKGROUND OF THE INVENTION

Embodiments of the present invention relate generally to semiconductor devices and their methods of manufacture, and more particularly, to high voltage superjunction metal-oxide-semiconductor field-effect transistors (MOSFETs) designed for increased reliability in the presence of radiation.

When semiconductor devices, such as power MOSFETs, are utilized in the upper atmosphere or in space (e.g., on rockets, satellites, space stations, or the like), they must maintain reliability despite the presence of potentially damaging cosmic rays. This is also true in other environments where the semiconductor device may be subjected to radiation doses above and beyond typical working conditions. Reliability parameters for such devices and conditions often refer to catastrophic events such as Single Event Burnout (SEB) and Single Event Gate Rupture (SEGR).

An example architecture for a conventional high voltage superjunction MOSFET 10 is shown in FIG. 1. A semiconductor substrate 12 has formed thereon a semiconductor layer 14 having a plurality of n-type and p-type columns 16, 18 formed therein. Highly doped source/drain regions 20 and body contact regions 22 are formed at a surface of the semiconductor layer 14 opposite the semiconductor substrate 12. Body regions 24 are also formed at the same surface and separate respective source/drain regions 20 and body contact regions 22 from the n- and p-columns 16, 18. A gate electrode 26 overlies a portion of the subject surface of the semiconductor layer 14, and is spaced apart therefrom by a dielectric layer 28. A source/drain electrode 30 connects to the source/drain regions 20 and body contact regions 22. However, high voltage superjunctions MOSFETs, such as those shown in FIG. 1, are known to fail at a source/drain voltage Vds of between about 10% and about 30% of the maximum rated Vds for both SEB and SEGR.

It is therefore desirable to provide a high voltage superjunction MOSFET with a higher Vds failure threshold for both SEB and SEGR events.

BRIEF SUMMARY OF THE INVENTION

Briefly stated, an embodiment of the present invention comprises a high voltage superjunction MOSFET including a semiconductor substrate having opposing first and second main surfaces and a first concentration of a first conductivity type. A semiconductor layer has opposing first and second main surfaces and includes a first column of the first conductivity type and a second column of the second conductivity type opposite to the first conductivity type. The first and second columns extend from the second main surface of the semiconductor layer toward the first main surface of the semiconductor layer. The first column has a second concentration of the first conductivity type that is less than the first concentration, and the second column has a third concentration of the second conductivity type. A buffer layer is disposed between the first main surface of the semiconductor substrate and the second main surface of the semiconductor layer. The buffer layer has a fourth concentration of the first conductivity type that is less than the first concentration. A plug region is formed at the first main surface of the semiconductor layer and extends to the first and second columns. The plug region has a fifth concentration of the second conductivity type, and the fifth concentration is greater than the third concentration. A source/drain region is formed at the first main surface of the semiconductor layer and is connected to the plug region. The source/drain region has a sixth concentration of the first conductivity type, and the sixth concentration is between about $1\times10^{19}$ cm$^{-3}$ to about $1.5\times10^{20}$ cm$^{-3}$. A body region is disposed between the source/drain region and the first column and is connected to the plug region. The body region has a seventh concentration of the second conductivity type that is lower than the fifth concentration. A gate trench is formed in the first main surface of the semiconductor layer and extends toward the first column. The source/drain region and the body region are adjacent a sidewall of the gate trench. A trench gate electrode is disposed within the gate trench, and a dielectric layer is at least partially disposed within the gate trench and separates the trench gate electrode from the first column.

In one aspect, the buffer layer has a thickness measured between the semiconductor layer and the semiconductor substrate of between about 40 µm and about 60 µm. In another aspect, the fourth concentration in the buffer layer is between about $3\times10^{16}$ cm$^{-3}$ to about $3\times10^{17}$ cm$^{-3}$.

In another aspect, the plug region extends to a depth from the first main surface of the semiconductor layer of between about 1.3 µm to about 1.8 µm. In another aspect, the plug region has a width in a direction parallel to first main surface of the semiconductor layer of between about 3 µm to about 6 µm. In yet another aspect, the fifth concentration in the plug region is between about $2\times10^{19}$ cm$^{-3}$ to about $5\times10^{19}$ cm$^{-3}$.

In another aspect, the body region has a width extending from the gate trench in a direction parallel to the first main surface of the semiconductor layer of between about 0.1 µm to about 1 µm.

In another aspect, the trench gate electrode is spaced apart from the first column by the dielectric layer by a distance of between about 10 nm to about 200 nm.

In another aspect, the gate trench has a width in a direction parallel to the first main surface of the semiconductor layer of between about 0.25 µm to about 0.5 µm.

Another embodiment of the present invention comprises a method of forming a high voltage superjunction MOSFET. The method includes providing a semiconductor substrate having opposing first and second main surfaces and a first concentration of a first conductivity type and forming a buffer layer on the first main surface of the semiconductor substrate. The buffer layer has a second concentration of the first conductivity type that is less than the first concentration. The method further includes forming a semiconductor layer having opposing first and second main surfaces. The second main surface is disposed on a surface of the buffer layer opposite to the semiconductor substrate. The method further includes forming a trench at the first main surface of the semiconductor layer and extending at least partially through the semiconductor layer and forming first and second columns in the semiconductor layer extending from the second main surface of the semiconductor layer toward the first main surface of the semiconductor layer. The first column has a third concentration of the first conductivity type less than the first concentration. The second column is located between the first column and the trench and has a fourth concentration of a second conductivity type opposite to the first conductivity type. The method further includes forming a plug region at the first main surface of the semiconductor layer and extending to the first and second columns. The plug region has a fifth concentration of the second conductivity type, and the fifth concentration is greater than the fourth concentration. The method further includes forming a gate trench in the first main surface of the semiconductor layer above the first column and forming a source/drain region at the first main surface of the semiconductor layer, adjacent to a sidewall of the gate trench and connected to the plug region. The source/drain region has a sixth concentration of the first conductivity type, and the sixth concentration is between about $1 \times 10^{19}$ cm$^{-3}$ to about $1.5 \times 10^{20}$ cm$^{-3}$. The method further includes forming a body region adjacent to the sidewall of the gate trench and connected to the plug region. The body region has a seventh concentration of the second conductivity type that is lower than the fifth concentration. The body region is disposed between the source/drain region and the first column. The method further includes forming a dielectric layer at least partially within the gate trench and forming a trench gate electrode on the dielectric layer within the gate trench.

In one aspect, the method further includes filling the trench with a dielectric material.

In another aspect, the source/drain region is formed after the formation of the gate trench.

In another aspect, the plug region is formed before the formation of the gate trench.

In another aspect, the buffer layer is formed to have a thickness measured between the semiconductor layer and the semiconductor substrate of between about 40 μm and about 60 μm. In yet another aspect, the second concentration in the buffer layer is between about $3 \times 10^{16}$ cm$^{-3}$ to about $3 \times 10^{17}$ cm$^{-3}$.

In another aspect, the fifth concentration in the plug region is between about $2 \times 10^{19}$ cm$^{-3}$ to about $5 \times 10^{19}$ cm$^{-3}$.

In another aspect, the body region is formed having a width extending into the semiconductor layer from the gate trench of between about 0.1 μm to about 1 μm.

In another aspect, the dielectric layer in the gate trench prior to formation of the trench gate electrode has a thickness measured from a bottom of the gate trench of between about 10 nm to about 200 nm.

In another aspect, the gate trench is formed having a width in a direction parallel to the first main surface of the semiconductor layer of between about 0.25 μm to about 0.5 μm.

BRIEF DESCRIPTION OF THE SEVERAL VIEWS OF THE DRAWINGS

The following detailed description of preferred embodiments of the invention will be better understood when read in conjunction with the appended drawings. For the purpose of illustration, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1:
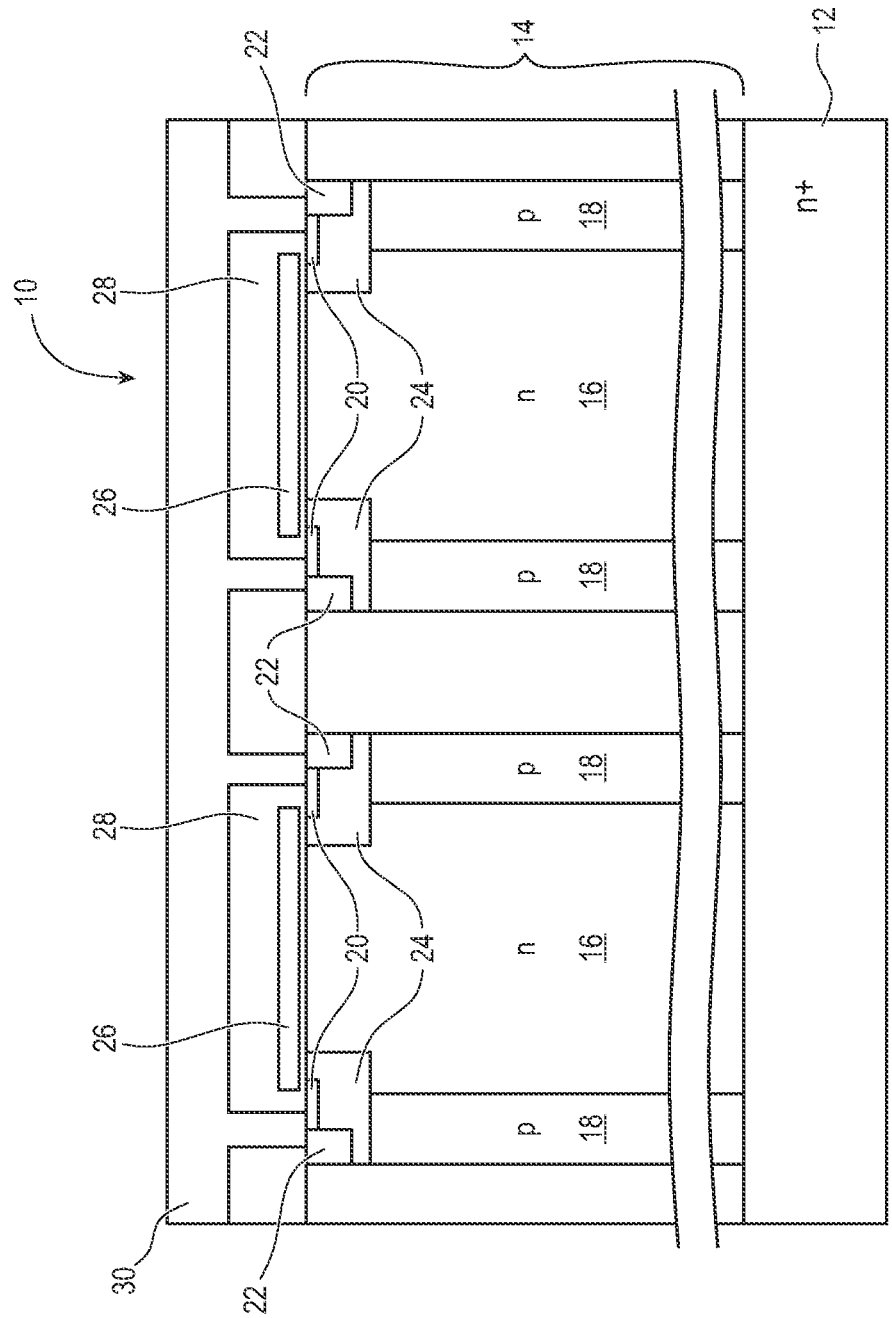
FIG. 1 is an enlarged partial cross-sectional elevational view of a conventional high voltage superjunction MOSFET.

Certain terminology is used in the following description for convenience only and is not limiting. The words "right", "left", "lower", and "upper" designate directions in the drawings to which reference is made. The words "inwardly" and "outwardly" refer to directions toward and away from, respectively, the geometric center of the device and designated parts thereof. The terminology includes the above-listed words, derivatives thereof, and words of similar import. Additionally, the words "a" and "an", as used in the claims and in the corresponding portions of the specification, mean "at least one." Unless stated otherwise, terms such as "first" and "second" are used to arbitrarily distinguish between the elements such terms describe. Thus, these terms are not necessarily intended to indicate temporal or other prioritization of such elements.

It should also be understood that the terms "about," "approximately," "generally," "substantially" and like terms, used herein when referring to a dimension or characteristic of a component of the invention, indicate that the described dimension/characteristic is not a strict boundary or parameter and does not exclude minor variations therefrom that are functionally similar. At a minimum, such references that include a numerical parameter would include variations that, using mathematical and industrial principles accepted in the art (e.g., rounding, measurement or other systematic errors, manufacturing tolerances, etc.), would not vary the least significant digit.

As used herein, reference to conductivity will be limited to the embodiment described. However, those skilled in the art know that p-type conductivity can be switched with n-type conductivity and the device would still be functionally correct (i.e., a first or a second conductivity type). Therefore, where used herein, reference to n or p can also mean either n or p or p and n can be substituted therefor.

Furthermore, n$^+$ and p$^+$ refer to heavily doped n and p regions, respectively; n$^{++}$ and p$^{++}$ refer to very heavily doped n and p regions, respectively; n$^-$ and p$^-$ refer to lightly doped n and p regions, respectively; and n$^{--}$ and p$^{--}$ refer to very lightly doped n and p regions, respectively. However, such relative doping concentration terms should not be construed as limiting.

Figure 2:
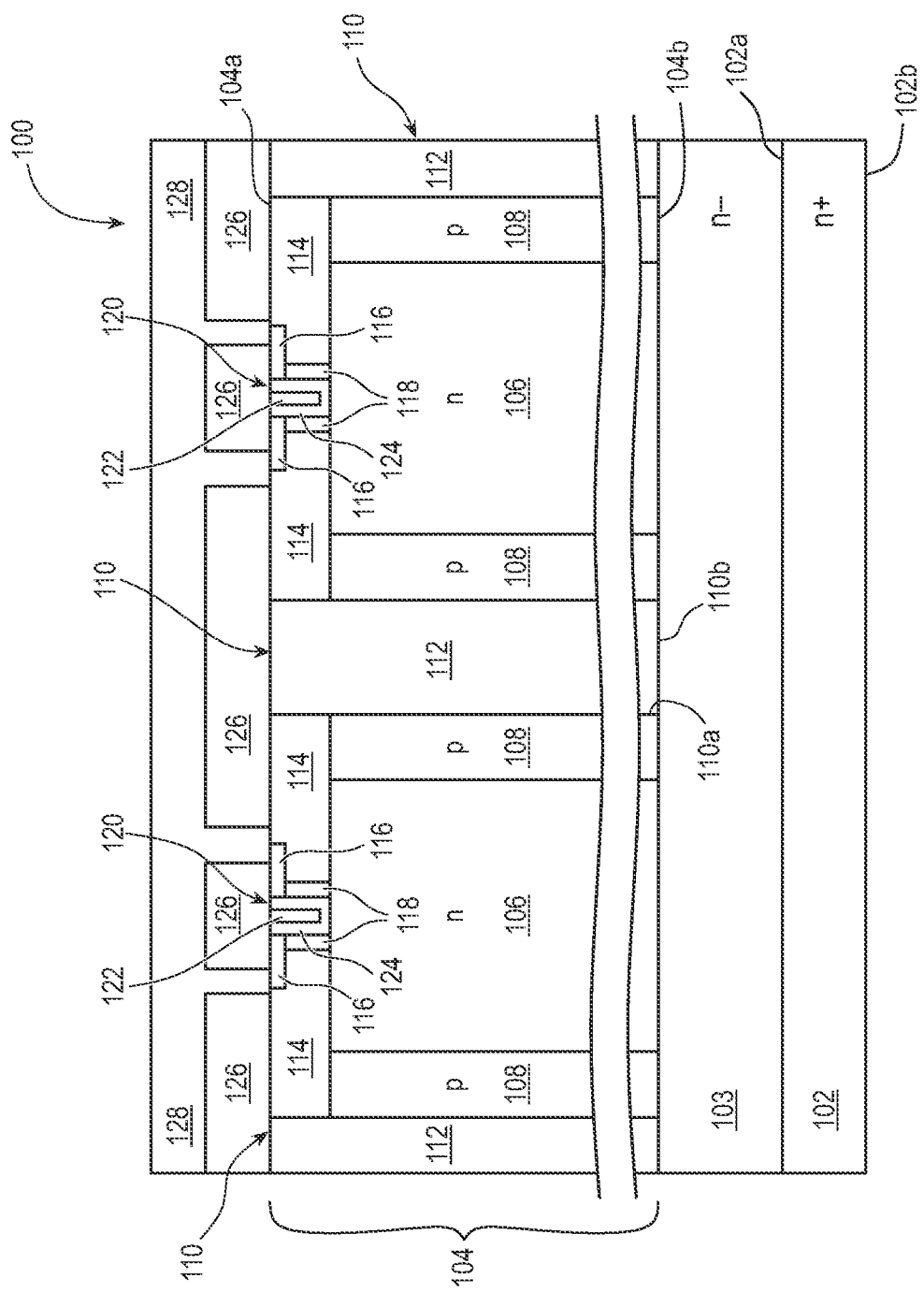
FIG. 2 is an enlarged partial cross-sectional elevational view of a high voltage superjunction MOSFET in accordance with an example embodiment of the present invention.

Referring to FIG. 2, there is shown an enlarged, partial cross-sectional, elevational view of a high voltage superjunction MOSFET 100 in accordance with an example embodiment of the present invention. The device 100 preferably includes a semiconductor substrate 102 having opposed first and second main surfaces 102a, 102b, and which may be of a heavily-doped n+ type. A buffer layer 103 is preferably disposed on the first main surface 102a of the semiconductor substrate 102. The buffer layer 103 is also preferably of n-type, although the concentration is preferably lower than the concentration of the semiconductor substrate 102. A semiconductor layer 104 may also be provided having opposed first and second main surfaces 104a, 104b. The second main surface 104b of the semiconductor layer 104 being disposed on a surface of the buffer layer 103 opposite to the semiconductor substrate 102. In this manner, the buffer layer 103 is disposed between the first main surface 102a of the semiconductor substrate 102 and the second main surface 104b of the semiconductor layer 104. The semiconductor layer 104 may include a pair, and preferably a plurality, of alternating n and p columns 106, 108 that extend at least partially from the second main surface 104b of the semiconductor layer 104 toward the first main surface 104a of the semiconductor layer 104. The concentration within the n columns 106 is preferably less than the concentration of the semiconductor substrate 102 and may be less than the concentration in the buffer layer 103.

In the embodiment shown in FIG. 2, the n and p columns 106, 108 begin at the second main surface 104b of the semiconductor layer 104 and the interface with the buffer layer 103. However, the invention is not so limited. There may be a gap between one or both of the n- and p-columns 106, 108 and the second main surface 104b of the semiconductor layer 104. In another alternative, a thin layer of material (not shown) may be disposed between the semiconductor layer 104 and the buffer layer 103.

At least one, and preferably more, trenches 110 may formed to extend at least partially through the semiconductor layer 104 from the first main surface 104a thereof. Each trench 110 includes a sidewall 110a and a bottom 110b. In the embodiment shown in FIG. 2, the trench 110 extends entirely through the semiconductor layer 104 such that the bottom 110b is formed by a surface of the buffer layer 103. However, the invention is not so limited. The trench 110 may only extend partially through the semiconductor layer 104, in which case a portion of the semiconductor layer 104 would form the bottom 110b of the trench 110. In still other embodiments, the trench 110 may extend through the semiconductor layer 104 and partially into the buffer layer 103, or through the buffer layer and partially into the semiconductor substrate 102, for example. In the example shown in FIG. 2, one of the p columns 108 is disposed between the trench 110 and a nearby n column 106, although other arrangements of device components in the semiconductor layer 104 may be utilized as well. For example, the p column 108 may extend to a shorter depth than the trench 110 such that the trench sidewall 110a may also be in contact with an n-doped portion of the semiconductor layer 104.

The trenches 110 in FIG. 2 are shown as being filled with a dielectric fill material 112, such as an oxide or the like. However, the invention is not so limited. For example, in some embodiments, the trenches 110 may remain largely unfilled (although the sidewalls 110a and/or bottoms 110b of the trenches 110 may be lined with material (not shown). In such cases, openings of the trenches 110 would be sealed, and the trenches 110 may contain one or more gases, such as inert gas or air, or be sealed under vacuum.

Highly doped (e.g., p+) plug regions 114 may be formed at the first main surface 104a of the semiconductor layer 104 adjacent respective sidewalls 110a of the trenches 110. The plug regions 114 preferably extend from the first main surface 104a of the semiconductor layer 104 to corresponding n and p columns 106, 108. Highly doped (e.g., n+) source/drain regions 116 may also be formed at the first main surface 104a of the semiconductor layer 104 and connected to respective plug regions 114. Body regions 118 (such as p doped regions) may be formed between respective source/drain regions 116 and n columns 106. The body regions 118 further connect to respective plug regions 114.

Gate trenches 120 may be formed in the first main surface 104a of the semiconductor layer 104 and extend toward respective n columns 106. Sidewalls of the gate trenches 120 are preferably adjacent to respective source/drain regions 116 and body regions 118. For example, the sidewalls of the gate trenches 120 may be formed by respective source/drain regions 116 and body regions 118. However, the gate trench 120 sidewalls may also be adjacent to a portion of the respective n column 106. The gate trenches 120 in FIG. 2 are shown with bottoms adjacent to (e.g., formed by) the respective n columns 106, but in some embodiments the bottoms of the gate trenches 120 may be spaced apart from the n columns by one or more intervening regions (not shown).

Each gate trench 120 may have a trench gate electrode 122 disposed therein. Each trench gate electrode 122 is preferably disposed entirely within the respective gate trench 120, but in some embodiments a portion of the trench gate electrode 122 may from inside the gate trench 120 beyond the first main surface 104a of the semiconductor layer 104. Each trench gate electrode 122 is provided spaced apart from the sidewalls and bottom of the respective gate trench 120 (and therefore, spaced apart from the adjacent n column 106, source/drain regions 116, and body regions 118) by a dielectric layer 124 at least partially disposed within the gate trench 120. An inter-dielectric oxide layer 126 may be formed over the trench gate electrodes 122 and other portions of the first main surface 104a of the semiconductor layer 104, including over the trenches 110. A metal source/drain electrode 128 preferably connects with the source/drain regions 116 and plug regions 114 through the inter-dielectric oxide layer 126.

FIGS. 3-6 generally show various steps of manufacturing the superjunction MOSFET 100 shown in FIG. 2.

Figure 3:
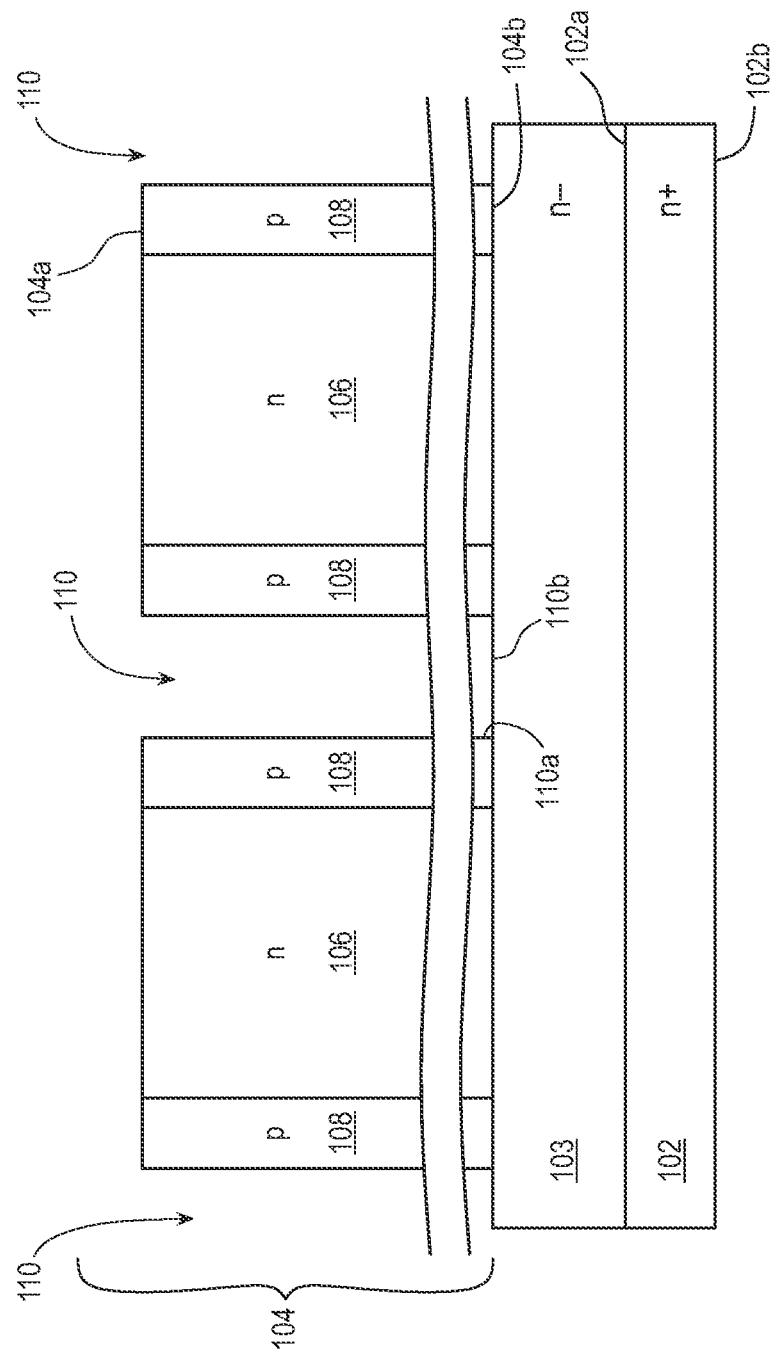
FIG. 3 is an enlarged partial cross-sectional elevational view of a semiconductor substrate, buffer layer, and semiconductor layer in accordance with an example embodiment.

Referring to FIG. 3, the semiconductor substrate 102 is preferably formed of silicon (Si). But, the semiconductor substrate 102 may be formed of other materials such as gallium arsenide (GaAs), germanium (Ge), or the like. The semiconductor substrate 102 preferably is of the heavily doped n+ type, e.g., having a concentration between about $1 \times 10^{18}$ cm$^{-3}$ to about $5 \times 10^{20}$ cm$^{-3}$.

The buffer layer 103 is formed on the first main surface 102a of the semiconductor substrate 102 and is similarly preferably formed of silicon, but can be formed of other materials (e.g., gallium arsenide, germanium, or the like). In some embodiments, the buffer layer 103 may be bonded to the semiconductor substrate 102. The bonding process may include annealing the semiconductor substrate 102 and the buffer layer 103 in an annealing furnace at up to 1200° C. for a period of about a few minutes to several hours. Optionally, the bonding steps may include wetting the surfaces of the semiconductor substrate 102 and the buffer layer 103 to be joined with a solution such as water ($H_2O$) and hydrogen peroxide ($H_2O_2$) and then pressing the wetted surface together and drying them prior to annealing at 800-1200° C. Plasma etches may be used to remove impure oxides on the surfaces of the semiconductor substrate 102 and the buffer layer 103 to be bonded. Alternatively, the buffer layer 103 may be epitaxially grown or deposited on the first main surface 102a of the semiconductor substrate 102. In other embodiments, the semiconductor substrate 102 and the buffer layer 103 may be formed from a single block of semiconductor material that is doped or implanted to form the two different layers.

The buffer layer 103 preferably has a thickness (measured between the semiconductor layer 104 and the semiconductor substrate 102) of between about 40 μm and about 60 μm, and more preferably, the buffer layer 103 has a thickness of about 50 μm. The buffer layer 103 also preferably has an n-type concentration between about $3\times10^{16}$ cm$^{-3}$ to about $3\times10^{17}$ cm$^{-3}$, and more preferably, the buffer layer 103 has an n-type concentration of about $3.5\times10^{16}$ cm$^{-3}$.

The semiconductor layer 104 is formed such that the second main surface 104b is disposed on a surface of the buffer layer 103 opposite to the semiconductor substrate 102. In some embodiments, the semiconductor layer 104 may be epitaxially grown on a surface of the buffer layer 103 and may be a lightly doped n$^-$ or intrinsically n doped silicon layer. The epitaxial growth or deposition may occur in a suitable reaction chamber at a temperature of up to about 1200° C. to a desired thickness. Other methods for forming the semiconductor layer 104 on the buffer layer 103, such as by bonding, annealing, and the like, may be used. In other embodiments, the buffer layer 103 and the semiconductor layer 104 may be formed from a single block of semiconductor material that is doped to form the two different layers prior to bonding or adhering the same to the semiconductor substrate 102.

The trenches 110 are formed in the first main surface 104a of the semiconductor layer 104. The trenches 110 are preferably etched using deep reactive ion etching (DRIE). DRIE utilizes an ionized gas, or plasma, such as, for example, sulfur hexafluoride ($SF_6$), to remove material from the semiconductor layer 104. DRIE technology permits deeper trenches 110 with straighter sidewalls. Other techniques for forming the trenches 110 can be used, however, such as plasma etching, reactive ion etching (RIE), sputter etching, vapor phase etching, chemical etching, or the like.

A mask (not shown) is selectively applied over the first main surface 104a of the semiconductor layer 104. The mask may be created by deposition of a layer of photoresist or in some other manner well known to those skilled in the art. The developed photoresist is removed, and undeveloped photoresist remains in place as is known in the art. For simplification, the mask refers to the material used to prevent certain areas of a semiconductor from being etched, doped, coated or the like. In certain embodiments, a thin layer of oxide or other dielectric material (not shown) may be applied to the first main surface 104a of the semiconductor layer 104 prior to formation of the mask. The trenches 110 are formed in the areas not covered by the mask. After the trenching process, the mask is removed using techniques known in the art.

The sidewalls 110a of each trench 110 can be smoothed, if needed, using, for example, one or more of the following process steps: (i) an isotropic plasma etch may be used to remove a thin layer of silicon (typically 100-1000 Angstroms) from the trench 110 surfaces or (ii) a sacrificial silicon dioxide layer may be grown on the surfaces of the trench 110 and then removed using an etch such as a buffered oxide etch or a diluted hydrofluoric (HF) acid etch. The use of the smoothing techniques can produce smooth trench surfaces with rounded corners while removing residual stress and unwanted contaminates. However, in embodiments where it is desirable to have vertical sidewalls and square corners, an anisotropic etch process will be used instead of the isotropic etch process discussed above. Anisotropic etching, in contrast to isotropic etching, generally means different etch rates in different directions in the material being etched.

If necessary, the sidewalls 110a of the trenches 110 are implanted or doped with an n-type dopant, which may occur at predetermined angles, to form the n columns 106. The implantation angles are determined by the width of the trenches 110 and the desired doping depth, and are typically from about 2° to 12° (-2° to -12°) from vertical. The implant is done at angles so that the bottom 110b of each trench 110 is not implanted. Preferably, the implantation occurs at least partially, and preferably entirely, between the first main surface 104a of the semiconductor layer 104 and the buffer layer 103. The implant is performed at an energy level of about 30-200 kilo-electron-Volts (KeV) with dose ranges from about 1E13 to 1E14 cm$^{-2}$ (i.e., about $1\times10^{13}$ to $1\times10^{14}$ cm$^{-2}$). Consequently, a dopant of the first conductivity type (e.g., n-type) is implanted into the semiconductor layer 104 to form doped regions of the first conductivity type having a doping concentration lower than that of the heavily doped semiconductor substrate 102 and also possibly lower than that of the buffer layer 103. For example, the concentration for the doped regions in the semiconductor layer 104 may be between about $1\times10^{15}$ cm$^{-3}$ to about $1\times10^{17}$ cm$^{-3}$. The doping may occur with the aid of a mask (not shown) placed over the first main surface 104a of the semiconductor layer 104.

The doping may be performed by one of ion implantation, solid diffusion, liquid diffusion, spin-on deposits, plasma doping, vapor phase doping, laser doping, or the like. Doping with boron B results in a more p-type region, doping with phosphorus P results in a more n-type region and doping with arsenic Ar results in a more n-type region. Other dopants may be utilized, such as antimony Sb, bismuth Bi, aluminum Al, indium In, gallium Ga or the like depending on the material and the desired strength of the doping. Preferably, the doping is performed by ion implantation.

Following implanting, a drive-in step at a temperature of up to 1200° C. may be performed for up to 12 hours. It should be recognized that the temperature and time are selected to sufficiently drive in the implanted dopant. But, the energy level used to perform ion implantation, as described above, may be high enough to sufficiently drive in the dopants without departing from the present invention. If the semiconductor layer 104 is already adequately doped for purposes of the resulting n column 106, then these steps may be omitted.

A similar doping step preferably occurs with respect to the sidewalls 110a of the trenches 110, but with a dopant of the opposite conductivity type (e.g., p-type), to form the p columns 108 that separate the n column 106 from the trench 110. The p columns 108 may have a concentration between about $1\times10^{15}$ cm$^{-3}$ to about $1\times10^{17}$ cm$^{-3}$.

In some embodiments, an oxide layer (not shown) may be formed over the first main surface 104a of the semiconductor layer 104, as well as on the sidewalls 110a and bottoms 110b of the trenches 110. Such oxide layer may be formed using thermal growth, low pressure (LP) chemical vapor deposition (CVD), plasma enhanced chemical vapor deposition (PECVD), atmospheric pressure chemical vapor deposition (APCVD), deposition, or the like.

Figure 4:
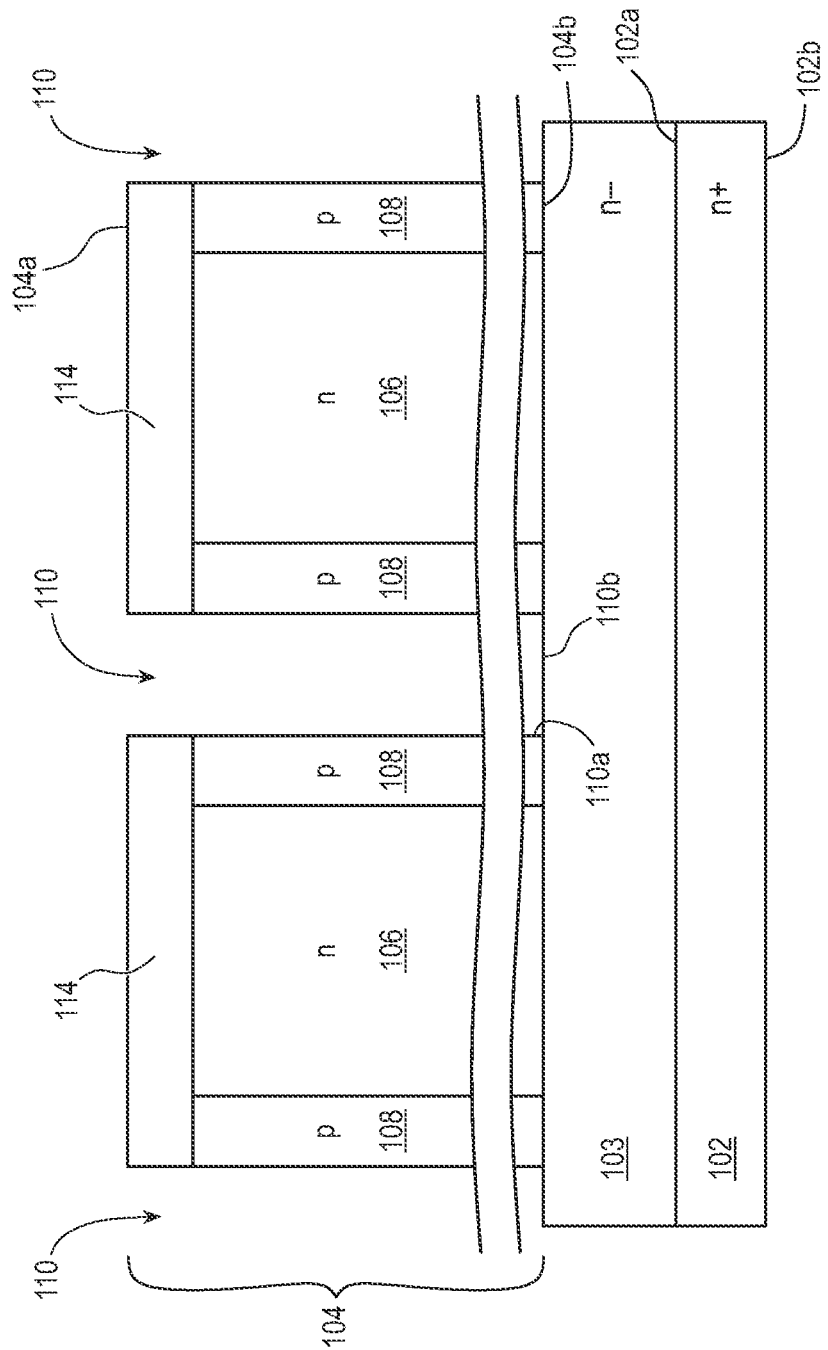
FIG. 4 is an enlarged partial cross-sectional elevational view of the device of FIG. 3 with plug regions formed thereon.

Referring to FIG. 4, one or more plug regions are formed at the first main surface 104a of the semiconductor layer 104 and partially along the sidewalls 110a of the trenches 110. The plug regions 114 are preferably of heavily doped p-type conductivity. The concentration is preferably between about $2\times10^{19}$ cm$^{-3}$ to about $5\times10^{19}$ cm$^{-3}$, and more preferably, the concentration in the plug regions 114 is about $2.26 \times 10^{19}$ cm$^{-3}$, which is about double the concentration found in a heavily-doped p$^+$ type body contact region 22 in a standard superjunction MOSFET (FIG. 1). In preferred embodiments, the plug regions 114 are formed by depositing an oxide layer (not shown) over the first main surface 104a of the semiconductor layer 104, followed by the ion implantation of a p-type dopant (or n-type dopant) into the n and p columns 106, 108 through the oxide layer at an energy level of about 30-1000 KeV with a dose range from about $1 \times 10^{10}$ to $1 \times 10^{16}$ atoms cm$^{-2}$, preferably from about $1 \times 10^{14}$ to $1 \times 10^{16}$ atoms cm$^{-2}$, followed by a high temperature drive-in step (i.e., a diffusion). Other methods may be utilized as are known in the art. In addition, the plug regions 114 can be formed at least partially by performing ion implantation of the sidewalls 110a of the trenches 110. Preferably the plug regions 114 extend to a depth into the semiconductor layer 104 measured from the first main surface 104a of the semiconductor layer 104 of between about 1.3 μm to about 1.8 μm, and more preferably, to a depth of about 1.42 μm. In comparison with the conventional superjunction MOSFET, the p$^+$ body contact regions 22, for example, typically extend to a depth of about 1.15 μm.

Figure 5:
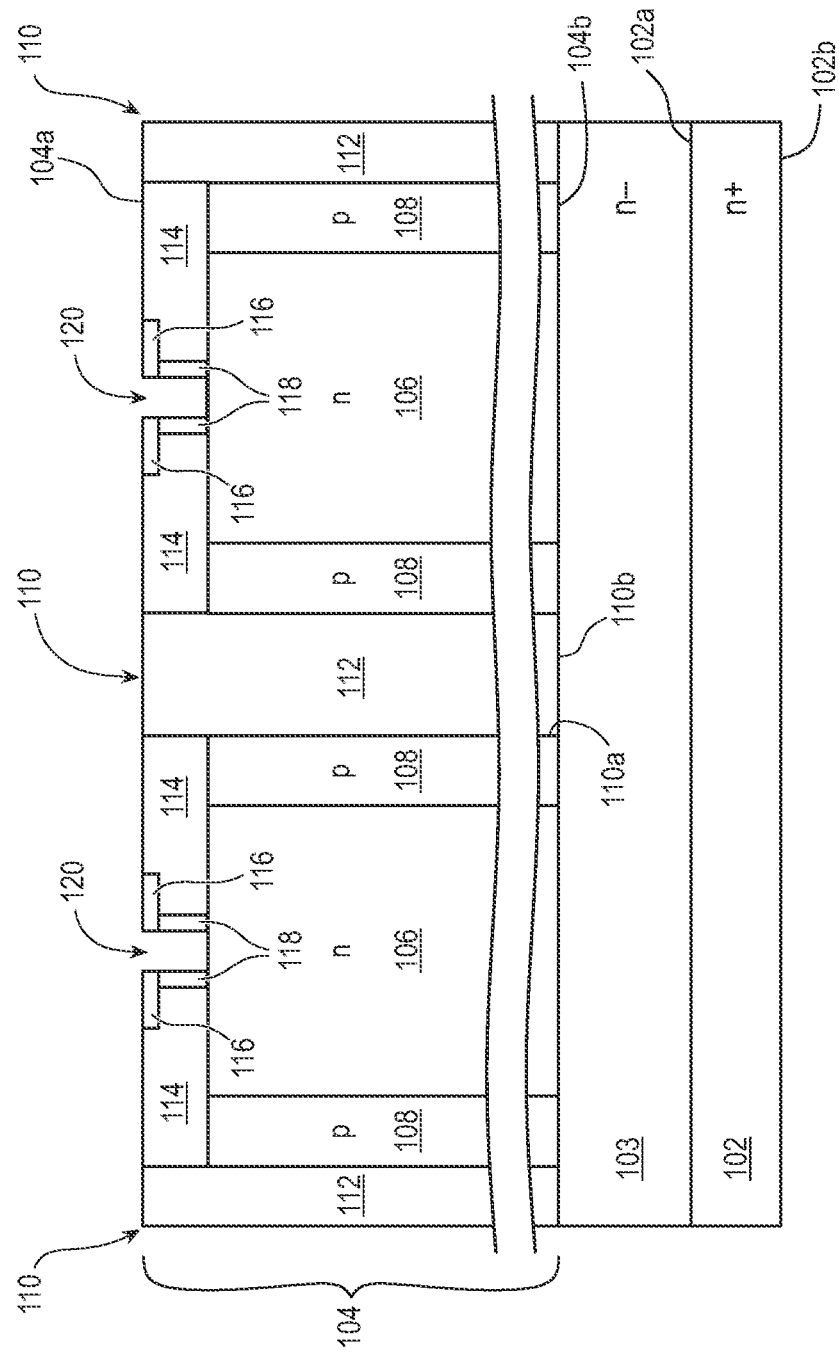
FIG. 5 is an enlarged partial cross-sectional elevational view of the device of FIG. 4 with source/drain regions, body regions, and gate trenches formed thereon.

Referring to FIG. 5, gate trenches 120 may be formed in the first main surface 104a of the semiconductor layer 104 within the previously formed plug regions 114 and above the n columns 106. Each gate trench 120 preferably extends to a depth measured from the first main surface 104a of the semiconductor layer 104 that is slightly greater than or equal to the depth of the corresponding plug region 114. The gate trenches 120 may be formed by techniques such as self-aligning silicon etching, slight silicon wet etching, or the like. In other embodiments, the plug regions 114 may be formed after the formation of the gate trenches 120. In still further embodiments, the plug regions 114 may be formed first, but as separate regions rather than a single, continuous region between trenches 110, and therefore the gate trenches 120 may be formed in the first surface 104a of the semiconductor layer 104 without removing material from the plug regions 114.

Source/drain regions 116 may also be formed at the first main surface 104a of the semiconductor layer 104 and adjacent to respective sidewalls of the gate trenches 120. As the source/drain regions 116 are preferably formed in the previously formed plug regions 114, the source/drain regions 116 connect to the plug regions 114. The source/drain regions 116 are preferably heavily doped n$^+$ type regions, which may be formed using techniques similar to those described above for formation of the plug regions 114, and may utilize the gate trenches 120 to aid in implantation/doping processes. Preferably, the concentration of the source/drain regions 116 is between about $1 \times 10^{19}$ cm$^{-3}$ to about $1.5 \times 10^{20}$ cm$^{-3}$ and more preferably, the source/drain region 116 concentration is about $5.95 \times 10^{19}$ cm$^{-3}$.

Body regions 118 may be formed adjacent to the gate trench 120 sidewalls, and each ends up being disposed between the respective source/drain region 116 and the n column 106. As the body regions 118 are formed in the previously formed plug regions 114, the body regions 118 connect to the plug regions 114. The body regions 118 are preferably of p-type conductivity, having a dopant concentration suitable for forming inversion layers that operate as conduction channels of the device 100, for example a concentration in the body region 118 may be between about $1 \times 10^{16}$ cm$^{-3}$ to about $5 \times 10^{17}$ cm$^{-3}$, and may be formed using techniques similar to those described above for formation of the plug regions 114, although ion implantation preferably takes place via the sidewalls of the gate trenches 120. Each body region 118 preferably also has a width extending from the gate trench 120 and measured in a direction parallel to the first main surface 104a of the semiconductor layer 104 of between about 0.1 μm to about 1 μm. More preferably, the width of the body region 104 is about 0.3 μm. In comparison, body regions 24 in conventional devices (see FIG. 1) typically have a width extending from the edge of a corresponding p column 18 of about 3.3 μm.

The orientation of the source/drain region 116 with respect to the body region 118 is not limited and can be varied depending upon the desired configuration of the device 100. Further, there is no limit to the order in which the two regions 116, 118 may be formed. In still other embodiments, the source/drain and body regions 116, 118 may be formed prior to formation of the gate trenches 120.

The trenches 110 may be filled with dielectric fill material 112, such as silicon dioxide, semi-insulating polycrystalline silicon (SIPOS), combinations thereof, or the like. The dielectric fill material 112 may be applied using CVD, thermal growth, spun-on-glass (SOG) techniques, or the like. In alternative embodiments, the trenches 110 are not filled, but may be lined with an oxide layer according to conventional techniques and are sealed by either the inter-dielectric oxide layer 126 (FIG. 6) or by a separate sealing material (not shown).

Figure 6:
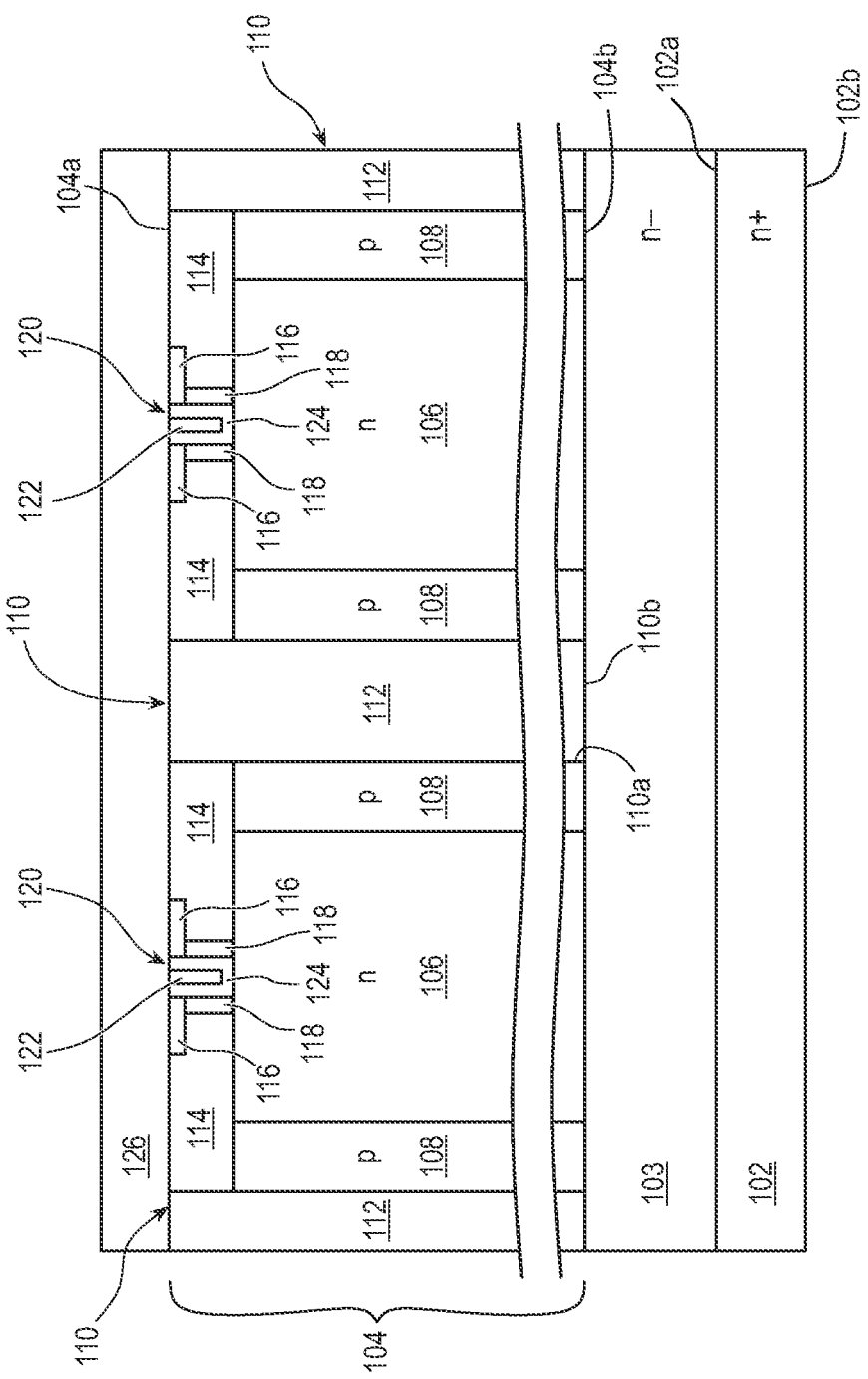
FIG. 6 is an enlarged partial cross-sectional elevational view of the device of FIG. 5 with trench gate electrodes formed thereon.

Referring to FIG. 6, a dielectric layer 124 may be grown or deposited at least partially within the gate trenches 120. In some embodiments, a thin oxide layer (not shown) is deposited on the sidewalls and bottom of the gate trench 120 as a pad for silicon nitride deposition. A thin layer of silicon nitride (not shown) is then deposited (e.g., via CVD) on the thin oxide layer on the sidewalls and bottom of the trench. The silicon nitride is then selectively removed (e.g., by RIE) from the gate trench 120 bottom, but allowed to remain on the gate trench 120 sidewalls. A dielectric layer 124 of desired thickness is then formed on the gate trench 120 bottom (oxide growth on the gate trench 120 sidewalls is prevented by the silicon nitride which remains). The silicon nitride is then removed from the gate trench 120 sidewalls. Rounding of the thick bottom dielectric material 124 can be accomplished by further etching. Preferably, the thickness of the dielectric material 124 at the bottom of the gate trench 120 is between about 10 nm to about 200 nm, and more preferably, the thickness is about 200 nm. The dielectric layer 124 may be silicon dioxide, silicon oxynitride, silicon nitride, tantalum pentoxide, titanium dioxide, barium strontium titanate, combinations thereof, or the like.

Trench gate electrodes 122 are then formed on the dielectric layer 124 within the gate trenches 120 and may be composed of, for example, a metal, a doped polysilicon, an amorphous silicon, or a combination thereof, and formed by conventional techniques.

This architecture significantly differs from the active area of a conventional device 10 (FIG. 1) in several additional ways. Aside from utilizing trench gate electrodes 122, the body regions 118 are much smaller and are preferably confined to an area adjacent the gate trenches 120. The body regions 118 also no longer directly connect with the p columns 108. In addition, whereas body regions 24 separated by the n column 16 in the conventional device 10 are typically spaced apart by a distance on the order of about 5.4 μm, nearby body regions 118 in the example embodiment are separated mainly by the width (in a direction parallel to the first main surface 104a of the semiconductor layer 104) of the shared gate trench 122, which preferably is between about 0.25 μm to about 0.5 μm. More preferably, the gate trench 122 width (and separation between body regions 118) is about 0.3 µm. Still further, a width of the plug region 114, taken from the adjacent trench 110 and measured in a direction parallel to the first main surface 104a of the semiconductor layer 104, is between about 3 µm to about 6 µm, and more preferably about 5.55 µm. A body contact region 22 in a conventional device 10, for comparison, typically only has a width of about 1 µm, and does not directly connect with either the n or p columns 16, 18.

The inter-dielectric oxide layer 126 may be formed over the first main surface 104a of the semiconductor layer 104, including over the trenches 110 (filled or unfilled) and gate trenches 120. The inter-dielectric oxide layer 126 may be formed according to dielectric layer formation techniques described above (e.g., thermal growth, LPCVD or the like). The inter-dielectric oxide layer 126 may further be planarized, using CMP or the like. Contact holes (FIG. 2) may be formed in the inter-dielectric oxide layer 126 using conventional oxide etching techniques. Using methods known in the field, metallization is performed to deposit a layer of metal 128, which serves as the source/drain electrode, over the contact hole openings, and the remaining inter-dielectric oxide layer 126, thereby coupling the source/drain electrode 128 to the source/drain regions 116. Passivation is performed using methods known in the field with an appropriate passivation material such as nitride, oxide or phosphosilicate glass (PSG) to arrive at the device 100 shown in FIG. 2.

With the improvements described above, it is possible to increase the failure threshold for both SEB and SEGR to source/drain voltages Vds of about 600 V, a near ten-fold increase in reliability.

Those skilled in the art will recognize that boundaries between the above-described operations are merely illustrative. The multiple operations may be combined into a single operation, a single operation may be distributed in additional operations and operations may be executed at least partially overlapping in time. Further, alternative embodiments may include multiple instances of a particular operation, and the order of operations may be altered in various other embodiments.

While specific and distinct embodiments have been shown in the drawings, various individual elements or combinations of elements from the different embodiments may be combined with one another while in keeping with the spirit and scope of the invention. Thus, an individual feature described herein only with respect to one embodiment should not be construed as being incompatible with other embodiments described herein or otherwise encompassed by the invention.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed:

1. A semiconductor device, comprising:
    a substrate;
    a semiconductor layer;
    a first trench formed through the semiconductor layer;
    a second trench formed through the semiconductor layer;
    a plug region formed within the semiconductor layer and extending between the first trench and second trench;
    a body region formed within the plug region;
    a source/drain region formed within the plug region, wherein a width of the source/drain region across the semiconductor layer is less than a width of the plug region and a width of the body region across the semiconductor layer is less than a width of the source/drain region;
    a gate trench formed adjacent to the source/drain region and body region and extending into the semiconductor layer;
    a dielectric layer disposed within the gate trench; and
    a trench gate electrode disposed within the gate trench.

2. The semiconductor device of claim 1, further including an insulating material formed in the first trench and second trench.

3. The semiconductor device of claim 1, further including:
    a first column of semiconductor material formed within the semiconductor layer between the first trench and second trench; and
    a second column of semiconductor material formed within the semiconductor layer between the first trench and second trench.

4. The semiconductor device of claim 1, wherein the plug region is highly doped between $2 \times 10^{19}$ cm$^{-3}$ and $5 \times 10^{19}$ cm$^{-3}$.

5. The semiconductor device of claim 1, further including a buffer layer disposed between the substrate and the semiconductor layer.

6. A semiconductor device, comprising:
    a semiconductor layer;
    a plug region formed within the semiconductor layer;
    a body region formed within the plug region;
    a source/drain region formed within the plug region, wherein a width of the source/drain region across the semiconductor layer is less than a width of the plug region and a width of the body region across the semiconductor layer is less than a width of the source/drain region;
    a gate trench formed adjacent to the source/drain region and extending into the semiconductor layer;
    a dielectric layer disposed within the gate trench; and
    a trench gate electrode disposed within the gate trench.

7. The semiconductor device of claim 6, further including:
    a first trench formed through the semiconductor layer; and
    a second trench formed through the semiconductor layer.

8. The semiconductor device of claim 7, further including an insulating material formed in the first trench and second trench.

9. The semiconductor device of claim 7, further including:
    a first column of semiconductor material formed within the semiconductor layer between the first trench and second trench; and
    a second column of semiconductor material formed within the semiconductor layer between the first trench and second trench.

10. The semiconductor device of claim 6, wherein the plug region is highly doped between $2 \times 10^{19}$ cm$^{-3}$ and $5 \times 10^{19}$ cm$^3$.

11. The semiconductor device of claim 6, further including:
    a substrate;
    a buffer layer disposed over the substrate; and
    the semiconductor layer disposed over the buffer layer.

12. A semiconductor device, comprising:
    a semiconductor layer;
    a first trench and a second trench formed through the semiconductor layer;

a plug region formed in the semiconductor layer between the first trench and second trench;
a body region formed within the plug region;
a source/drain region formed within the plug region, wherein a width of the source/drain region across the semiconductor layer is less than a width of the plug region and a width of the body region across the semiconductor layer is less than a width of the source/drain region;
a gate trench formed adjacent to the source/drain region; and
a trench gate electrode disposed within the gate trench.

13. The semiconductor device of claim 12, further including an insulating material formed in the first trench and second trench.

14. The semiconductor device of claim 12, further including:
a first column of semiconductor material formed within the semiconductor layer between the first trench and second trench; and
a second column of semiconductor material formed within the semiconductor layer between the first trench and second trench.

15. The semiconductor device of claim 12, wherein the plug region is highly doped between $2\times10^{19}$ cm$^{-3}$ and $5\times10^{19}$ cm$^{-3}$.

16. The semiconductor device of claim 12, further including a dielectric layer disposed within the gate trench.

17. The semiconductor device of claim 16, wherein a thickness of the dielectric layer under the gate trench electrode ranges from 10 nanometers to 200 nanometers.

18. The semiconductor device of claim 12, wherein a doping concentration of the plug region is sufficiently different from a doping concentration of the body region to allow the body region to operate as a channel of the semiconductor device.

19. The semiconductor device of claim 1, wherein a doping concentration of the plug region is sufficiently different from a doping concentration of the body region to allow the body region to operate as a channel of the semiconductor device.

20. The semiconductor device of claim 6, wherein a doping concentration of the plug region is sufficiently different from a doping concentration of the body region to allow the body region to operate as a channel of the semiconductor device.

21. A semiconductor device, comprising:
a semiconductor layer;
a first trench formed through the semiconductor layer;
a second trench formed through the semiconductor layer;
a plug region formed in the semiconductor layer;
a body region formed within the plug region;
a source/drain region formed within the plug region, wherein a width of the source/drain region across the semiconductor layer is less than a width of the plug region and a width of the body region across the semiconductor layer is less than a width of the source/drain region;
a gate trench formed adjacent to the source/drain region; and
a trench gate electrode disposed within the gate trench.

22. A semiconductor device, comprising:
a semiconductor layer;
a first trench formed through the semiconductor layer;
a second trench formed through the semiconductor layer;
a plug region formed in the semiconductor layer;
a body region formed within the plug region, wherein a doping concentration of the plug region is sufficiently different from a doping concentration of the body region to allow the body region to operate as a channel of the semiconductor device;
a source/drain region formed within the plug region;
a gate trench formed adjacent to the source/drain region; and
a trench gate electrode disposed within the gate trench.

23. The semiconductor device of claim 22, further including an insulating material formed in the first trench and second trench.

24. The semiconductor device of claim 22, further including:
a first column of semiconductor material formed within the semiconductor layer between the first trench and second trench; and
a second column of semiconductor material formed within the semiconductor layer between the first trench and second trench.

25. The semiconductor device of claim 22, wherein the plug region is highly doped between $2\times10^{19}$ cm$^{-3}$ and $5\times10^{19}$ cm$^{-3}$.

26. The semiconductor device of claim 22, further including a dielectric layer disposed within the gate trench.

27. The semiconductor device of claim 26, wherein a thickness of the dielectric layer under the gate trench electrode ranges from 10 nanometers to 200 nanometers.

* * * * *